United States Patent
Lee et al.

(10) Patent No.: US 12,261,055 B2
(45) Date of Patent: *Mar. 25, 2025

(54) SLURRY COMPOSITIONS FOR CHEMICAL MECHANICAL PLANARIZATION

(71) Applicant: Taiwan Semiconductor Manufacturing Co., Ltd., Hsin-Chu (TW)

(72) Inventors: An-Hsuan Lee, Hsinchu (TW); Chun-Hung Liao, Hsinchu (TW); Chen-Hao Wu, Hsinchu (TW); Shen-Nan Lee, Hsinchu County (TW); Teng-Chun Tsai, Hsinchu (TW); Huang-Lin Chao, Hsinchu (TW)

(73) Assignee: TAIWAN SSEMICONDUCTOR MANUFACTURING CO., LTD., Hsinchu (TW)

(*) Notice: Subject to any disclaimer, the term of this patent is extended or adjusted under 35 U.S.C. 154(b) by 64 days.

This patent is subject to a terminal disclaimer.

(21) Appl. No.: 17/982,028

(22) Filed: Nov. 7, 2022

(65) Prior Publication Data

US 2023/0058800 A1 Feb. 23, 2023

Related U.S. Application Data

(63) Continuation of application No. 16/991,975, filed on Aug. 12, 2020, now Pat. No. 11,495,471.

(Continued)

(51) Int. Cl.
*H01L 21/321* (2006.01)
*C09G 1/02* (2006.01)
*H01L 21/768* (2006.01)

(52) U.S. Cl.
CPC .......... *H01L 21/3212* (2013.01); *C09G 1/02* (2013.01); *H01L 21/7684* (2013.01)

(58) Field of Classification Search
CPC ............ H01L 21/3212; H01L 21/7684; H01L 21/31053; C09G 1/02
See application file for complete search history.

(56) References Cited

U.S. PATENT DOCUMENTS 11,495,471 B2 * 11/2022 Lee ................... H01L 21/7684
2002/0111024 A1 * 8/2002 Small .................... C09G 1/02
438/689

(Continued)

OTHER PUBLICATIONS

Liang Jiang et al., "Effect of Ionic Strength on Ruthenium CMP in H2O2-Based Slurries", Applied Surface Science 317 (2014) 332-337. 6 Pages.

(Continued)

*Primary Examiner* — Binh X Tran
(74) *Attorney, Agent, or Firm* — HAYNES AND BOONE, LLP

(57) ABSTRACT

The method includes receiving a semiconductor device having a first surface and a second surface. The first surface is a top surface including a conductive material exposed thereon; and the second surface is an embedded surface including the conductive material and a dielectric material. The method also includes selecting a first polishing slurry to achieve a first polishing rate of the conductive material in the first polishing slurry and a second polishing rate of the dielectric material in the first polishing slurry. The method further includes selecting a second polishing slurry to achieve a third polishing rate of the conductive material in the second polishing slurry and a fourth polishing rate of the dielectric material in the second polishing slurry. The method additionally includes polishing the first surface with the first polishing slurry until the second surface is exposed; and polishing the second surface with the second polishing slurry.

20 Claims, 11 Drawing Sheets

Related U.S. Application Data

(60) Provisional application No. 62/906,564, filed on Sep. 26, 2019.

(56) References Cited

U.S. PATENT DOCUMENTS

| | | | |
|---|---|---|---|
| 2002/0150196 A1* | 10/2002 | Fulconis | C01G 55/00 |
| | | | 376/308 |
| 2008/0038995 A1 | 2/2008 | Small et al. | |
| 2015/0232728 A1* | 8/2015 | Takahashi | C01F 17/235 |
| | | | 51/309 |
| 2016/0107286 A1* | 4/2016 | Sakashita | B24B 37/00 |
| | | | 451/36 |
| 2016/0358790 A1* | 12/2016 | Shi | H01L 21/31053 |
| 2018/0036859 A1* | 2/2018 | Lee | H01L 21/3212 |
| 2018/0294180 A1* | 10/2018 | Jiang | H01L 21/76877 |
| 2019/0227440 A1* | 7/2019 | Kamimura | G03F 7/167 |
| 2020/0219931 A1* | 7/2020 | Amanapu | H10B 61/00 |

OTHER PUBLICATIONS

Feng Du et al. "Catalytic H2 Auto Transfer Amination of Polyols to Alkyl Amines in one Pot Using Supported Ru Catalysts," Catalysis Today 302 (2018) 227-232, 6 pages.

McCoy (in an article named Smooth Success, Chemical mechanical planarization is becoming indispensable in chip-making, by Michael McCoy, Jul. 12, 2010; Chemical & Engineering News vol. 88, Issue 28, found in Web page https://cen.acs.org/articles/88/i28/Smooth-Success.html) (Year: 2020).

\* cited by examiner

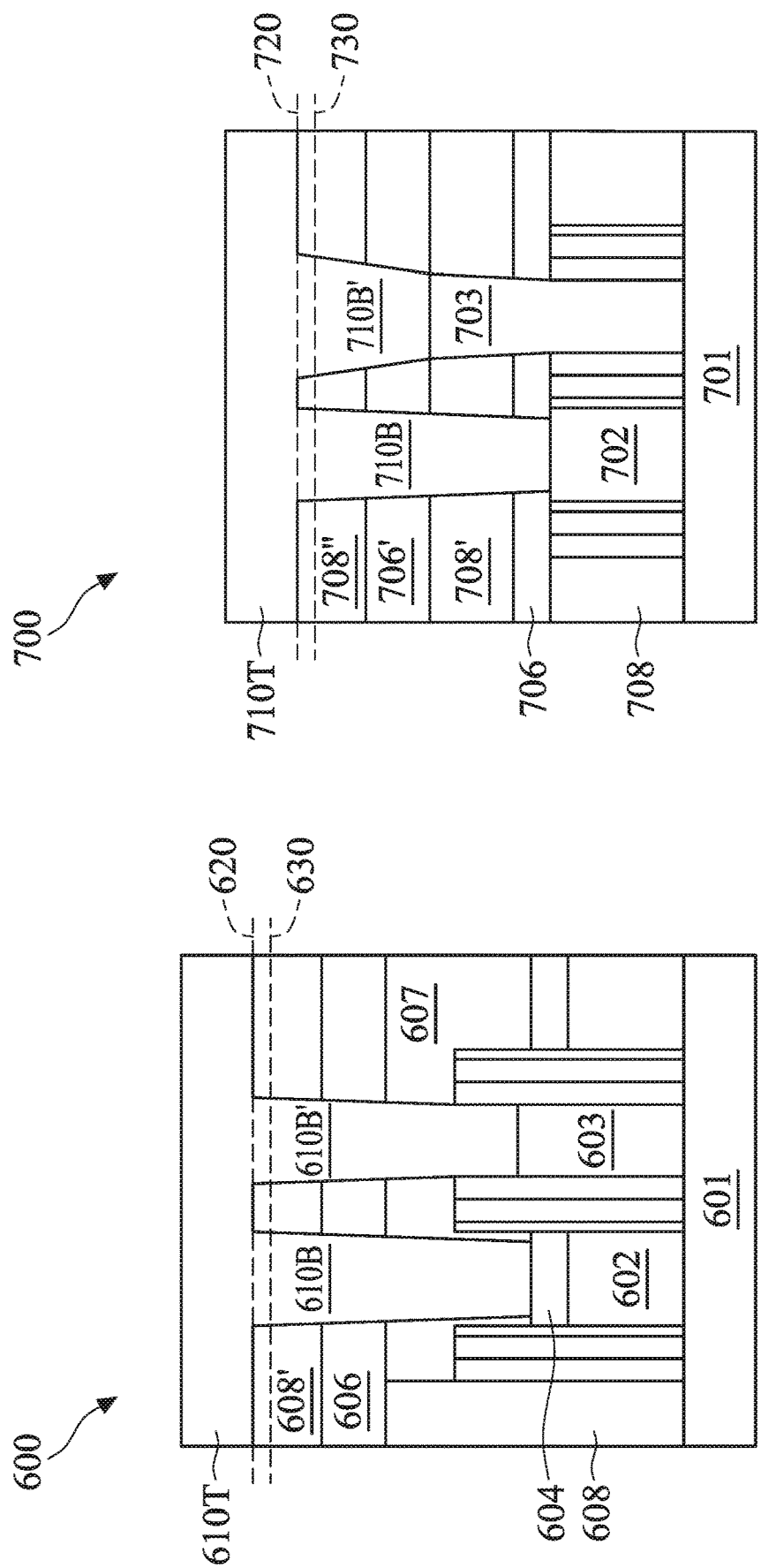

SLURRY COMPOSITIONS FOR CHEMICAL MECHANICAL PLANARIZATION

CROSS-REFERENCE TO RELATED APPLICATIONS

This is a continuation application of U.S. patent application Ser. No. 16/991,975, filed on Aug. 12, 2020, which is a non-provisional application of and claims priority to U.S. Provisional Patent Application Ser. No. 62/906,564, filed on Sep. 26, 2019, each of which is herein incorporated by reference in its entirety.

BACKGROUND

Chemical Mechanical Planarization (CMP), also called Chemical Mechanical Polishing, is a surface polishing process utilizing a combination of chemical and mechanical mechanisms. In a typical CMP process, a substrate is pressed against a polishing pad in presence of an abrasive and corrosive chemical slurry while relative motions are maintained during the process between the polishing pad and the substrate. This process removes materials on the surface of the substrate and evens out certain irregular topography. As a result, the substrate becomes more flat or planar, and often more suitable for a subsequent fabrication step. CMP is necessary in many semiconductor manufacturing processes. However, slurry compositions often employed in current CMP processes are not effective to all substrate materials. Accordingly, while existing slurry compositions have been generally adequate for their intended purposes, they have not been satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-5C illustrate two-stage CMP processing of example semiconductor structures, according to various aspects of the present disclosure.

DETAILED DESCRIPTION

Figure 1:
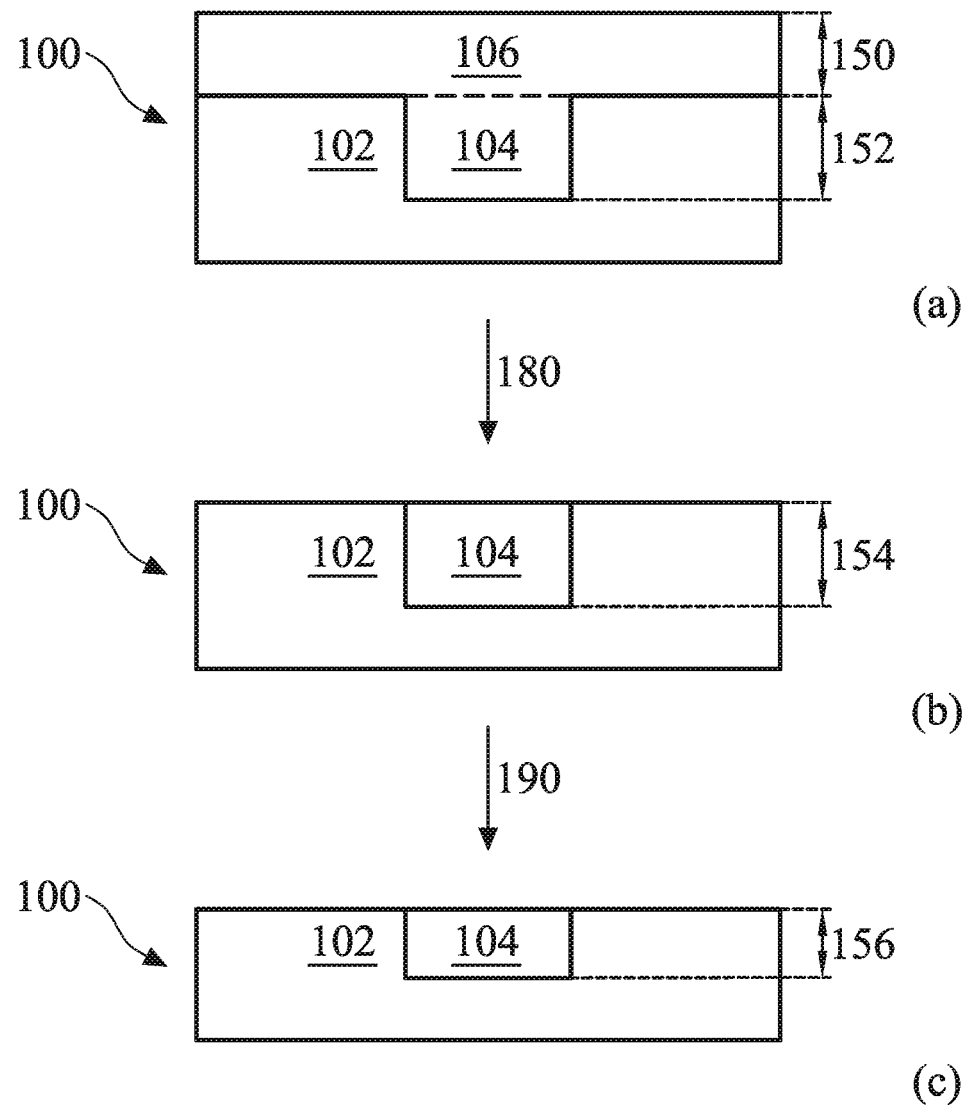
FIG. 1 illustrates fragmentary cross-sectional views of a semiconductor structure at different fabrication stages, according to various aspects of the present disclosure.

The present disclosure relates generally to integrated circuit (IC) devices and methods of preparing the same. More particularly, this present disclosure relates to a slurry composition for Chemical Mechanical Planarization (CMP), also called Chemical Mechanical Polishing, and methods of applying the CMP slurry compositions in various stages of the fabrication of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Chemical mechanical planarization (CMP) processes are widely used in the fabrication of semiconductor devices, such as integrated circuits (IC). As an IC is built up layer-by-layer on the surface of a semiconductor wafer, CMP processes are used to planarize the topmost layer or layers to provide a leveled surface for subsequent fabrication steps. CMP processes are carried out by placing the wafer in a carrier that presses the wafer surface to be polished against a polish pad attached to a platen. Both the platen and the wafer carrier are rotated while slurry containing both abrasive particles and reactive (such as oxidative and/or corrosive) chemicals are applied to the polish pad. The slurry is transported to the wafer surface via the rotation of the porous polish pad. The relative movement of the polish pad and wafer surface coupled with the reactive chemicals in the slurry allows the CMP process to level the wafer surface by means of both physical and chemical forces. For example, the chemical component of the slurry may chemically attack and soften the material on the wafer surface, and the abrasive particles grinds and removes the softened material away from the wafer surface. The newly exposed wafer surface is further subject to attack by the chemical component, and these processes are repeated until the desired amount of material is removed. CMP processes may be used to planarize the inter-level dielectric layer (ILD) and the inter-metal dielectrics (IMD) that separate the various circuit layers in an integrated circuit. CMP processes may also be used, for example, to planarize metal contact features, as well as to buff ILD layers with embedded via features, so as to control the height of the via features.

More recently, new metal materials have found uses in advanced technology nodes. This includes, for example, cobalt (Co), ruthenium (Ru), iridium (Ir), rhodium (Rh), osmium (Os), etc. These new metal materials bring with them multiple characteristics favorable for achieving faster and/or more powerful devices. For example, Ru has been found to have an electrical resistance that is lower than most conventional conductive materials at the relevant dimension. Furthermore, unlike conventional conductive materials often requiring barrier layers to avoid interlayer diffusions—which causes undesirable shift in device characteristics (such as threshold voltages)—Ru features suffer no such diffusions even in absence of the barrier layers. Accordingly, new metal materials like Ru are increasingly incorporated into semiconductor devices. However, utilizing such new metal materials comes with its unique challenges. Still using Ru as an example, it is more difficult to polish Ru materials using existing CMP slurry compositions than to polish conventional metal materials. Ru has a hardness parameter that exceeds many conventional abrasives, such as silicon oxide ($SiO_2$). One way to address this challenge is to introduce chemical oxidants, such as hydrogen peroxide ($H_2O_2$) and/or potassium periodate ($KIO_4$). For example, the chemical oxidants oxidize the Ru metal into its oxides, such as ruthenium oxide ($RuO_2$). Ruthenium oxide has a reduced hardness as compared to ruthenium metal, such that it can be more effectively removed by conventional abrasives. However, the oxidation capability of hydrogen peroxide against Ru is also limited. As a result, only a surface portion of the ruthenium metal is converted into ruthenium oxide, and only that surface portion is removed by the CMP slurry. Accordingly, the Ru removal rate is relatively low. For example, the removal rate of ruthenium material using a combination of $SiO_2$ abrasives and hydrogen peroxide oxidants, at a concentration of 1% by weight, saturates at around 50 Å per minute. Further increasing the concentration of hydrogen peroxide, or adjusting the amount of $SiO_2$ abrasives usually does not lead to a higher removal rate. Potassium periodate ($KIO_4$) is a stronger chemical oxidizer than hydrogen peroxide, such that a greater portion of the ruthenium feature may be converted into ruthenium oxide under similar conditions, and a greater removal rate may be reached. Unfortunately, the use of $KIO_4$ often causes undesirable surface roughness, and leaves unacceptable dark pad stains on the wafer surface. This may be a result of forming insoluble oxidation byproducts. Therefore, embodiments of the present disclosure provide new slurry compositions effective for the polishing and removal of metal materials, such as Ru, in a CMP process. While the disclosure below primarily references Ru metal, one of ordinary skills in the art understands that other metals having similar characteristics as Ru, may benefit from the present disclosure. Accordingly, those metals are also contemplated by the present disclosure. The present disclosure includes multiple embodiments. Different embodiments may have different advantages, and no particular advantage is necessarily required of any embodiment.

Embodiments of the present disclosure provides novel amine-based compositions useful as CMP slurry materials. The term amine includes inorganic amines (such as ammonia $NH_3$) and organic amines (or referred to as organoamines), includes neutral and ionic species (such as ammonium ($NH_4^+$) or organoammonium cations (or organic ammonium cations)), and includes amides (such as amides, R—C(=O)—$NR_2$, of carboxylic acids). The organoamines may be a primary organoamine, having a formula of $NH_2R$, a secondary organoamine, having a formula of $NHR_2$, and/or a tertiary organoamine, having a formula of $NR_3$. Similarly, the organoammonium cation may be a primary, a secondary, and/or a tertiary organoammonium ion, having a formula of $RNH_3^+$, $R_2NH_2^+$, and $R_3NH^+$, respectively. Here, each R is independently selected from a suitable organic residue, and can be the same as or different from one another. In some embodiments, each R is an optionally substituted alkyl group, such as an alkyl group having 1 to 20 carbon atoms. The subscript next to R denotes the number of R groups within the molecule or ion.

CMP slurry compositions described here may be used in different applications. In the depicted embodiments, two embodiments of the disclosed CMP slurry compositions are used in two different fabrication stages of a same semiconductor device. As described below, these two fabrication stages each requires a CMP process having different operational characteristics from each other.

Figure 2A:
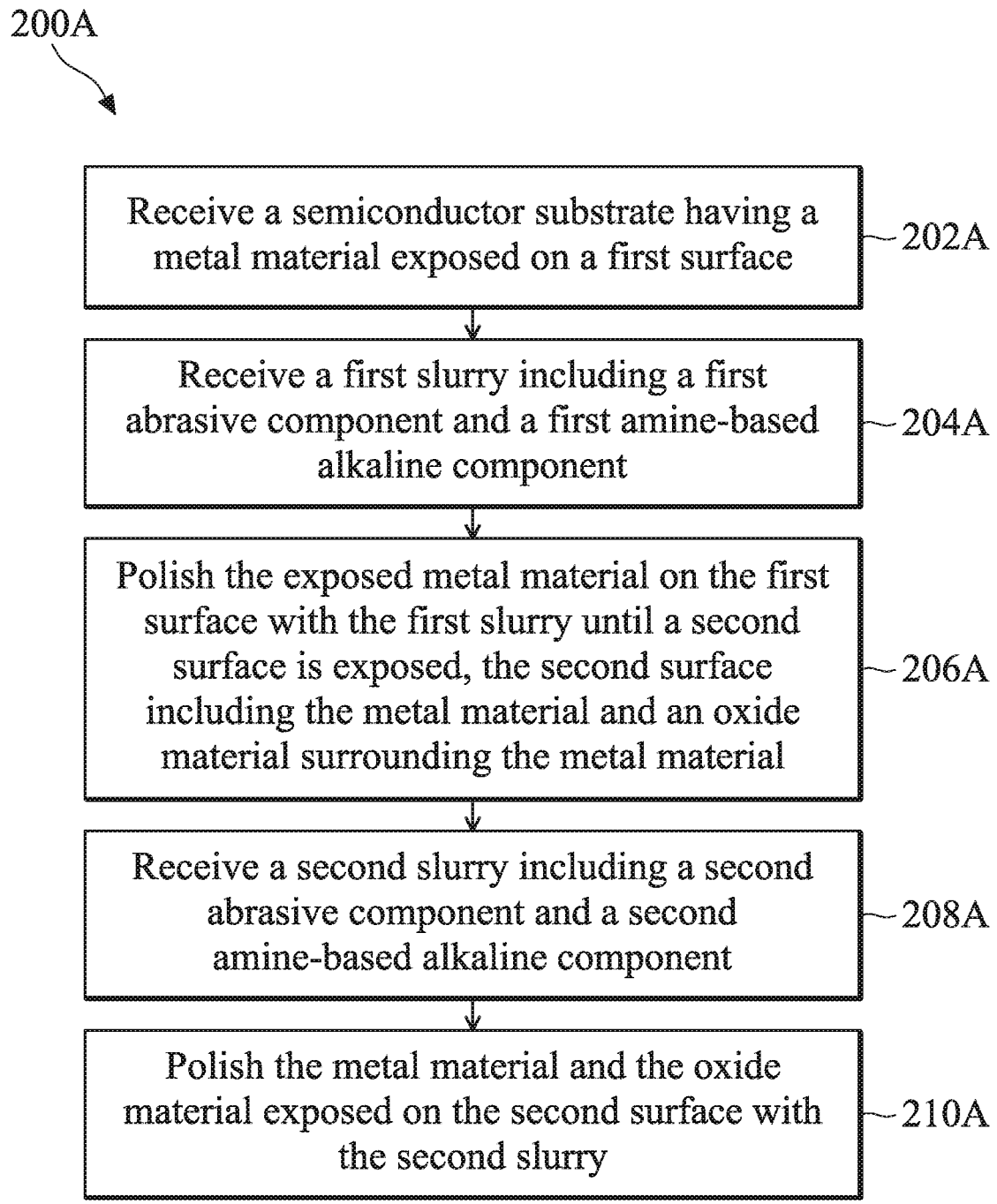
FIGS. 2A, 2B, and 2C are flow charts illustrating a CMP portion of a method of fabricating a semiconductor structure according to various aspects of the present disclosure.

Referring to panel (a) of FIG. 1 and block 202A of FIG. 2A, a semiconductor structure 100 is received. The semiconductor structure includes a dielectric layer 102. In some embodiments, the dielectric layer is an interlayer dielectric (ILD) and includes a dielectric material. The dielectric materials may be, for example, silicon dioxide, silicon nitride, silicon oxynitride, TEOS formed oxide, PSG, BPSG, low-k dielectric material, other suitable dielectric material, or combinations thereof. In the depicted embodiments, the dielectric layer 102 includes silicon dioxide ($SiO_2$). The semiconductor structure 100 further includes a metal feature 104 embedded within the dielectric layer 102, and a metal feature 106 formed over the dielectric layer 102. The metal feature 104 may have a height 152 along a vertical direction orthogonal to the top surface of the dielectric layer 102. The metal feature 106 may have a height 150 along the same vertical direction. The metal features 104 and 106 may be formed separately or in one depositing step. Although the metal feature 106 is depicted in FIG. 1 as having a planar top surface, the metal feature 106 may alternatively have a top surface with any suitable shape or profile. For example, the metal feature 106 may have a top surface profile that dips in the region where the metal feature 104 is formed. In some embodiments, the metal feature 106 may be a via feature. In some embodiments, the top surface of the metal feature 106 is of a substantially uniform composition of a single metal material. In the depicted embodiment, this metal material is Ru. In other words, the metal features 104 and 106 are of the same metal material, and are both Ru features.

Referring to block 204A of FIG. 2A, a CMP slurry 400 is received. The CMP slurry 400 is used to remove the entirety of the metal feature 106, and until a top surface of the dielectric layer 102 is exposed. Accordingly, the CMP slurry 400 may be designed to remove the metal feature 106 at a maximum rate (for maximum operational efficiency), while to remove the dielectric layer 102 at a minimum rate (so as to terminate the CMP operation thereon reliably). In some embodiments, the CMP slurry 400 includes an abrasive component, an oxidation component, and an alkaline component. In some embodiments, the abrasive component is selected from silicon dioxide ($SiO_2$), titanium oxide ($TiO_2$), cerium hydroxide ($Ce(OH)_x$), cerium dioxide ($CeO_2$), aluminum oxide ($Al_2O_3$). The size of the abrasive material may be about 1 nm to about 150 nm. If the size of the abrasive material is too large, for example, greater than about 150 nm, scratches may not be effectively removed from the processed surface; on the other hand, the present technical limit for producing abrasive materials may not afford a size below 1 nm. In some embodiments, the abrasive component includes titanium dioxide ($TiO_2$).

In some embodiments, the oxidizing component is selected from hydrogen peroxide ($H_2O_2$), periodate ($IO_4^-$), iodate ($IO_3^-$), hypochlorite ($ClO^-$), nitrate ($NO_3^-$), chloride ($Cl^-$), carbonate ($CO_3^{2-}$), and sulfate ($SO_4^{2-}$). The oxidizing component has an oxidation potential (or redox potential) that is more positive than that of the metal material (e.g. Ru) to be polished. In some embodiments, the oxidizing component has a weight percentage of about 0.01 wt % to about 15 wt % measured against the total weight of the slurry composition. If the weight percentage is too small, such as smaller than 0.01 wt %, the oxidization component may not be capable to oxidize a sufficient amount of the metal material, such that its effect is diminished. If the weight percentage is too large, such as larger than 15 wt %, the effectiveness of the oxidization component may have been saturated. In other words, not all of the oxidization component is efficiently utilized, leading to waste. In some embodiment, the oxidizing component includes hydrogen peroxide ($H_2O_2$).

In some embodiments, the alkaline component is selected from an organic amine, an inorganic ammonium ion ($NH_4+$), a soluble quaternary organoammonium ion, and an amide (collectively, amine-based alkalines). As will be described in more details, amine-based alkaline component adjusts the pH value of the slurry. Furthermore, the amine-based alkaline component assists the removal of metal material from the top surface by way of electrostatic attractions and/or forming coordination (or dative) bonds. In some embodiments, the alkaline component has a weight percentage of about 0.01 wt % to about 10 wt % measured against the total weight of the slurry composition. If the weight percentage is too small, such as smaller than 0.01 wt %, the electrostatic force and/or the coordination bonds provided by the alkaline component may not be sufficient to provide meaningful boost to the removal rate of the metal material. If the weight percentage is too large, such as larger than 15 wt %, the effectiveness of the alkaline component may have been saturated, and not all of the alkaline component is efficiently utilized, leading to waste. In some embodiments, the alkaline component includes inorganic ammonium hydroxide (such as $NH_4OH$) and/or organoammonium hydroxide (such as $NR_4OH$), where each R is independently selected from substituted or unsubstituted carbon chains of 1 to 20 carbon atoms. In some embodiments, the alkaline component includes organic amines, and the organic amine further includes a hydroxy group, for example, a hydroxyamine ($H_2N$—R—OH), where R is any organic residue, such as an optionally substituted alkyl group with a carbon chain with 1 to 20 carbon atoms. In some embodiments, the additional hydroxy (—OH) group provides additional coordination sites for the metal material (such as Ru) and/or assists the amine group (—$NH_2$) in forming chelating complex with the metal material. Accordingly, such hydroxy-bearing amines may be beneficial in enhancing the removal rate of the metal material.

In some embodiments, the CMP slurry 400 further includes an acid component. The acid component may be selected from nitric acid ($HNO_3$), acetic acid ($CH_3COOH$), malonic acid ($CH_2(COOH)_2$), oxalic acid ($C_2H_2O_4$), carbonic acid $C_6H_8O_7$, carbonic acid $C_3H_4O_4$, sulfuric acid ($H_2SO_4$), and other suitable acids. In some embodiments, the acid component is present at a weight percentage of about 0.01 wt % to about 10 wt % measured against the total weight of the slurry composition. At least one aspect of the functions served by the acid component is to regulate the pH value of the CMP slurry 400. If the weight percentage is too small, such as smaller than 0.01 wt %, the acid component may not be capable to adjust the pH value to the designed value. If the weight percentage is too large, such as larger than 10 wt %, pH value may become too low to maintain an effective oxidation reaction between the oxidization component and the Ru surface. In some embodiments, some acid components, such as nitric acid, malonic acid, and oxalic acid may also assert a chelating effect to the Ru material, such that coordinative bonds are formed between Ru and the acids, which facilitates the removal of the Ru material. In some embodiments, the CMP slurry 400 includes nitric acid ($HNO_3$). In some embodiments, the pH value of the CMP slurry 400 is maintained at about 10 to about 12.

Referring to step 180 and panel (b) of FIG. 1, as well as block 206A of FIG. 2A, the metal feature 106 is polished with the CMP slurry 400 until it is removed in its entirety. Accordingly, the height 150 is reduced to zero. Meanwhile, the polishing step 180 stops when a surface of the dielectric layer 102 is reached. In other words, after the polishing step 180, the metal feature 104 may have a height 154 that is substantially the same as the height 152 before the polishing step 180. This may be possible when the removal rate of the dielectric layer 102 in the CMP slurry 400 is far smaller than the removal rate of the metal material; or the removal rate of the Ru material in the CMP slurry 400 far exceeds the removal rate of the dielectric layer 102 in the CMP slurry 400. For example, this may be achieved when a ratio of the removal rates between the metal material and the dielectric material in the CMP slurry 400 exceeds 30:1, such as 50:1 or 100:1. If the ratio (or rate difference) is too small, such as smaller than 30:1, the polishing step 180 may not be effectively terminated at the top surface of the dielectric layer 102, which may lead to operational uncertainty. As described in detail below, it is the selection of the abrasive component, the oxidizing component, the alkaline component, and the acid component of the CMP slurry 400 that enables the reliable implementation of the CMP process to achieve this operational characteristics at the first fabrication stage (step 180 of FIG. 1).

Referring to block 208 of FIG. 2A, a CMP slurry 500 is received. The CMP slurry 500 also includes an abrasive component, an oxidation component, and an alkaline component. In some embodiments, the CMP slurry 500 also includes an acid component. The available options for the abrasive, oxidation, alkaline, and acid components are similar to those described above with respect to CMP slurry 400. However, the selection may be different from those of CMP slurry 400 in order to satisfy different operational characteristics of the second polishing step 190. This is because the selection criteria for the CMP slurry 500 is different from that for the CMP slurry 400.

Referring to panel (b) of FIG. 1, the surface to be polished in the second polishing step 190 includes two dissimilar materials, that is, a metal material (such as Ru), and a dielectric material (such as silicon dioxide). At this fabrication stage, the primary concern is to maintain a matched (or similar) polishing rate between these two dissimilar materials. For example, the rate of removal for the metal material and the rate of removal for the dielectric material is about 2:1 to about 1:2. If the ratio is either too low, for example, lower than 2:1, or too high, for example, higher than 1:2, the polished top surface will form irregularities. Furthermore, in some embodiments, substantially different polishing rates between the metal material and the dielectric material may cause the metal feature 104 be stretched upwards (the "pull-up" effect) and lead to increased electric resistance along its length. This is described in more detail below with respect to FIG. 4. In some embodiments, the abrasive component of the CMP slurry 500 includes silicon dioxide; the oxidizing component includes hydrogen peroxide; the alkaline component includes hydroxyamine (H$_2$N—R—OH), where R is any organic residue, such as an optionally substituted alkyl group with a carbon chain with 1 to 20 carbon atoms. In some embodiments, the CMP slurry 500 further includes acetic acid as the acid component. In some embodiments, the CMP slurry 500 further includes potassium hydroxide as a second alkaline component. A pH value of the CMP slurry 500 is maintained at about 9 to about 11.

Referring to step 190 and panel (c) of FIG. 1 and block 210 of FIG. 2A, the exposed surface is polished with the CMP slurry 500. The polishing step 190 causes the top surface of the metal feature 104 and the top surface of the dielectric 102 to be reduced at substantially similar rates, such that a height of the metal feature 104 is reduced to height 156. The height 156 is smaller than the height 154. Meanwhile, the top surface of the semiconductor structure 100 remains flat. In other words, the polished top surface of the metal feature 104 extends along the top surface of the polished dielectric layer 102.

The disclosure above provides a method 200A of polishing a semiconductor device 100 using two different CMP slurries for two different fabrication stages. The disclosure below also provides a method 200B on how to select appropriate components for the CMP slurries 400 and 500, respectively, to effectuate their distinctive goals. Referring to block 202B of FIG. 2B, a semiconductor device is received. The semiconductor device has a top surface including a conductive material (such as Ru) exposed thereon, and an embedded surface including the conductive material and a dielectric material (such as SiO$_2$). The top surface would then be polished with a CMP slurry 400. As described above, it is desirable to maximize the removal rate of the conductive material while minimizing the removal rate of the dielectric material in the CMP slurry 400. For example, the polishing rate for the conductive material far exceeds the polishing rate for the dielectric material in the CMP slurry 400, such as at a ratio exceeding 30:1.

Figure 2B:
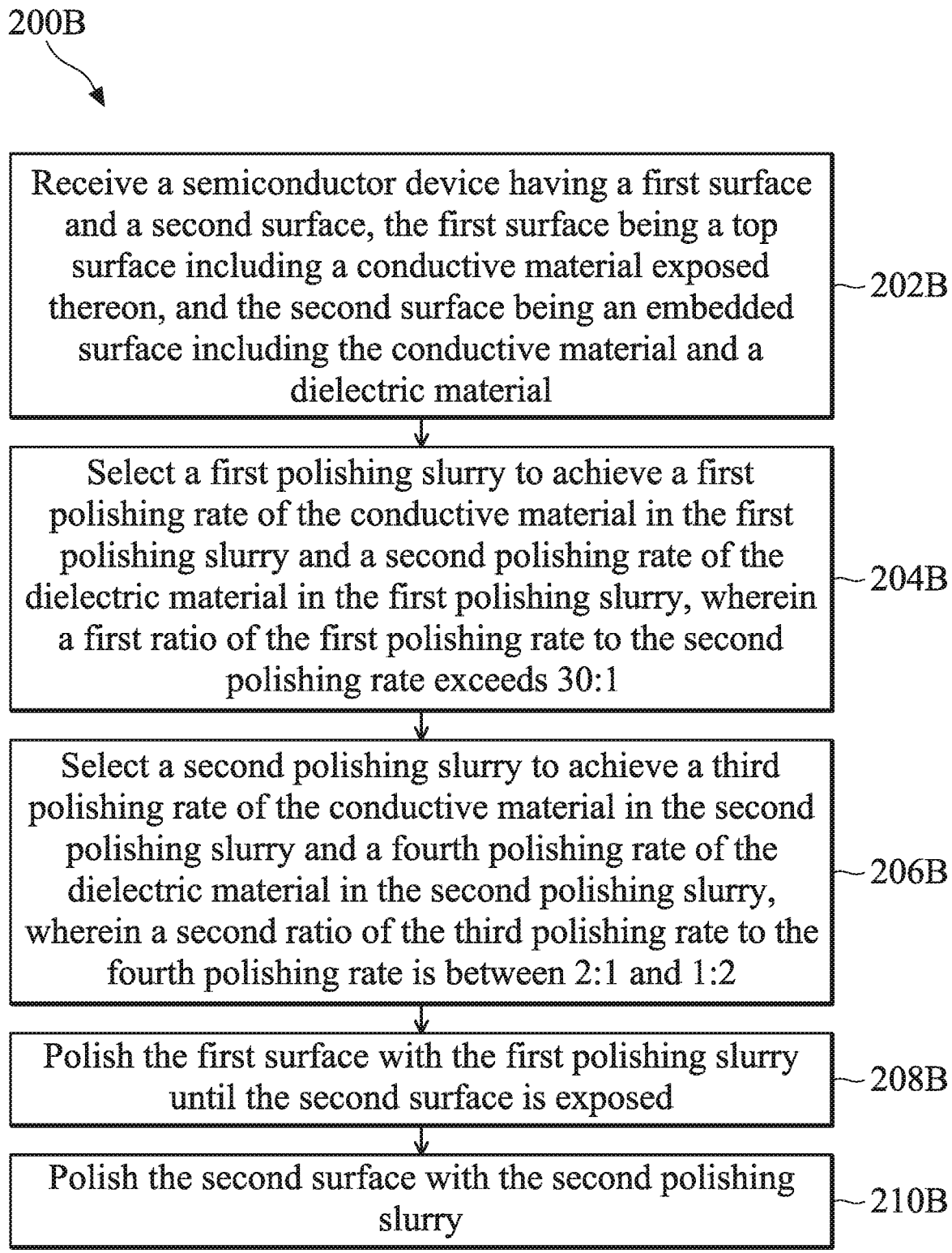

Referring to block 204B of FIG. 2B, CMP slurry 400 is selected in order to achieve the operational characteristics of a maximal removal rate of the conductive material and a minimal removal rate of the dielectric material. In order to rationally formulate CMP slurries to achieve the desired operational characteristics, it is necessary to understand the key differences between polishing the metal material (such as Ru) and polishing the dielectric material (such as SiO$_2$). For example, SiO$_2$ is a relatively redox-inert material. Accordingly, corrosive and abrasive components, but not the oxidizing component, play the predominant role in regulating its removal rate. By contrast, Ru is a redox-active material. Accordingly, unlike for SiO$_2$, the oxidizing component of the CMP slurry has a substantial impact on the removal rate of these metal materials. This is further explained below with respect to FIG. 3A. Therefore, embodiments of the present disclosure provide methods of tuning the redox aspect of the slurry compositions to achieve the desired operational characteristics. It should be noted that the redox aspect of the slurry composition is not only affected by the choice of the oxidizing components, but also affected by the choices of the abrasives and the pH values.

Figure 3A:
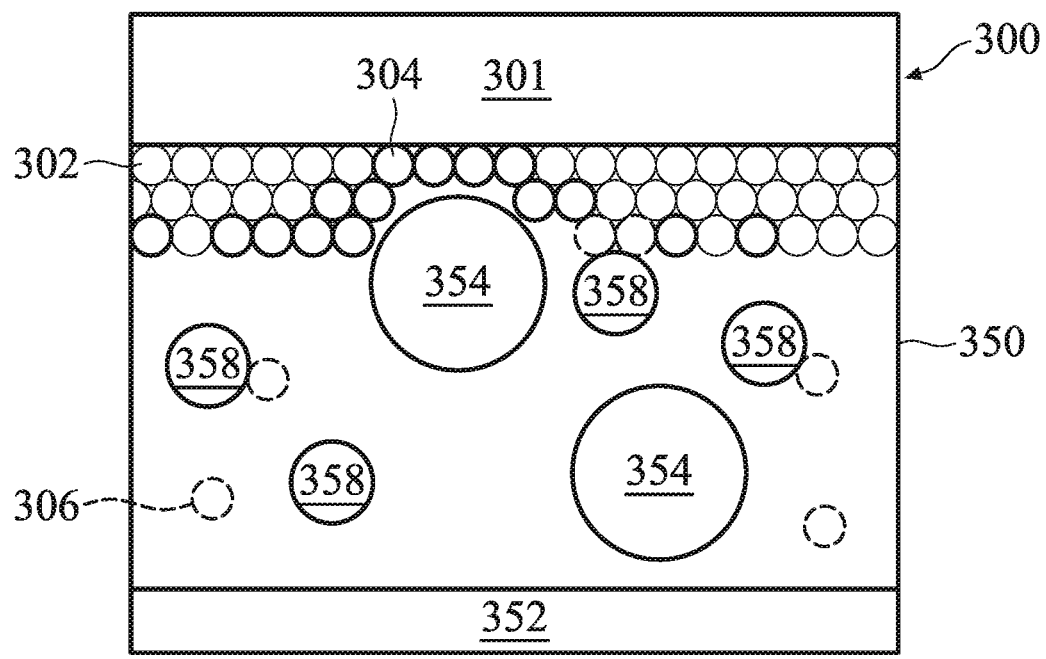
FIG. 3A is an illustration of CMP process on a metal surface, according to various aspects of the present disclosure.

Referring to FIG. 3A, a Ru surface 300 is provided. The Ru surface includes a level of roughness and can be considered to include a plurality of Ru particles 302-304 arranged on the top surface of the bulk Ru 301. The Ru surface is polished by a polishing pad 352 in presence of slurry composition 350. The slurry composition 350 includes abrasive particles 354 and alkaline components 356-358. The slurry composition 350 further includes oxidizing component and water that are not illustrated. During the CMP process, some of the surface Ru particles have their outer layers oxidized by the oxidizing component. For example, an outer layer of the Ru particles 302 are oxidized into a layer of ruthenium oxides (such as RuO$_2$) which surrounds the Ru metal core. When hydrogen peroxide is employed as the oxidizing component, these oxidization reactions are represented by the following equations:

$$H_2O_2 \rightarrow 2(\cdot OH)$$

$$Ru + 2H_2O_2 \rightarrow RuO_2 + 2H_2O$$

Meanwhile, some of the surface Ru particles have their outer layers oxidatively hydrolyzed. For example, an outer layer of the Ru particles 304 are oxidatively hydrolyzed into ruthenium hydroxides (such as Ru(OH)$_3$ and/or Ru(OH)$_4$), which surrounds the Ru metal core. These oxidative hydrolysis reactions are represented by the following equations:

$$H_2O_2 + 2e^- \rightarrow 2OH^-$$

$$Ru + 3OH^- \rightarrow Ru(OH)_3 + 3e^-$$

$$Ru + 4OH^- \rightarrow Ru(OH)_4 + 4e^-$$

$$Ru(OH)_4 \rightarrow RuO_2 + 2H_2O$$

These oxidation reactions and oxidative hydrolysis reactions produce Ru-containing oxides or hydroxides, during which, the metal is converted into a higher oxidation state (such as Ru(+3) and Ru(+4)) than its native oxidation state (0). These higher-oxidation state species are softer than Ru metal, thus more easily removed by abrasive forces. This facilitates a higher CMP removal rate than without the oxidizing component. However, these oxide and hydroxide materials are insoluble solids. Their presence impedes the penetration of oxidizing component into the inner portions of the bulk Ru 301. Therefore, the physical removal of these insoluble solids, a relatively slow process, becomes the rate-limiting step. To further boost the Ru removal rate, it may be desirable to form soluble Ru byproducts in lieu of insoluble oxides and hydroxides. Generally, metals in a higher oxidation state (such as Ru (+6) and Ru (+7)) are often more soluble in aqueous solutions than lower oxidation states (such as Ru (+3) and Ru (+4)). These metals in higher oxidation states may be achieved by employing oxidizing component with a more positive oxidation potential, such as KIO$_4$, and sodium hyperchloride (NaClO). However, as described above, these stronger oxidants can cause pad stain issues. Alternatively, these higher oxidation states may be achieved by adjusting the pH value of the slurry to a more basic (alkalic) condition, without changing the identity of the oxidizing components.

The oxidation of Ru is dependent upon an acidity (or basicity) of the slurry composition. For example, Ru is generally more susceptible to oxidation in a basic condition than in an acidic condition. Accordingly, a pH value of the slurry composition may affect the oxidation state of the Ru product from the oxidation. For example, at a pH value of about 4, elementary Ru (or Ru metal) is stable in an aqueous solution in absence of hydrogen peroxide or other oxidants. The addition of hydrogen peroxide into the aqueous solution may lead to oxidation of Ru into Ru(OH)$_3$, that is, Ru in a +3 oxidation state. Additionally, some Ru in a +4 oxidation state may also start to form as oxides RuO$_2$. As the pH value increases, the oxidation potential for oxidizing Ru generally decreases. For example, at a pH value of about 4, Ru is oxidized into Ru(OH)₃ at an applied potential of about 0.50 V against standard hydrogen electrode (SHE); this potential is lowered to about 0.30 V against SHE at a pH value of about 7; and further to about 0.20 V against SHE at a pH value of about 9. Furthermore, it requires an oxidant having an oxidation potential exceeding about 1.20 eV against SHE at a pH value of about 4 to form an anion form of Ru, $[RuO_4]^{2-}$, while it only requires an oxidant having an oxidation potential exceeding 0.70 eV against SHE to do so at a pH value of about 9. Consequently, even though hydrogen peroxide (having an oxidation potential of about 0.70 eV against SHE at the pH value of about 4), is incapable of forming the $[RuO_4]^{2-}$ at the pH value of 4, it is sufficient to do so at a pH value of about 9. Furthermore, Ru in even higher oxidations states, such as $[RuO_4]^-$ in a +7 oxidation state may be formed. These oxidation reactions may be represented by the following equations:

$$Ru(OH)_4 + 4OH^- \rightarrow (RuO_4)^- + 4H_2O + 3e^-$$

$$Ru + 8OH^- \rightarrow (RuO_4)^- + 4H_2O + 7e^-$$

$$RuO_2 + 4OH^- \rightarrow (RuO_4)^{2-} + H_2O + 2e^-$$

$$RuO_4^- + 2OH^- \rightarrow (RuO_4)^{2-} + H_2O + \tfrac{1}{2}O_2 + e^-$$

Therefore, by adjusting the pH value to beyond about 9, the otherwise insoluble oxides and/or hydroxides may be replaced by soluble Ru byproducts (such as Ru particle 306 of FIG. 3A). As a result, the inner portions of the bulk Ru 301 are more easily oxidized, leading to a higher Ru removal rate. In some embodiments, the pH value is maintained at about 9 to about 12. If the pH value is too low, for example, below 9, byproduct solubility remains a concern; if the pH value is too high, such as higher than 12, common abrasive components, such as silicon dioxide may lose its structural integrity and become a less effective abrasive.

Despite forming soluble oxidation byproducts, the accumulation of byproducts may still impede (albeit to a less extent) the further reaction. Based on the Le Chatelier principle, the faster the product is removed from the reaction system (here, the Ru surface), the faster the reaction proceeds to its completion. Therefore, it is beneficial to rapidly remove oxides, hydroxides, as well as $[RuO_4]^-$ and/or $[RuO_4]^{2-}$ anions alike, from the surface in order to maximize the Ru removal rate. Because $[RuO_4]^{2-}$ and $[RuO_4]^-$ are anions, they are electrostatically attracted by counter ions and may be pulled away from the reaction system by this electrostatic force. For example, in presence of amine and/or ammonium ions, these interactions may be represented by the following equations:

$$NH_3 + H_2O \rightarrow NH_4^+ + OH^-$$

$$NH_2-R-OH + H_2O + e^- R-NH_3^+ + 2OH$$

$$NH_2-R-NH_2 + 2H_2O \rightarrow NH_3^+-R-NH_3^+ + 2OH$$

$$(C_2H_5)_4N-OH(aq) \rightarrow (C_2H_5)_4N^+ + 2OH$$

$$2NH_4^+ + (RuO_4)^{2-} \rightarrow (NH_4)_2RuO_4$$

$$2R-NH_3^+ + (RuO_4)^{2-} \rightarrow R(NH_3)_2RuO_4$$

$$NH_3^+-R-NH_3^+ + (RuO_4)^{2-} \rightarrow R(NH_3)_2RuO_4$$

$$2(C_2H_5)_4N^+ + (RuO_4)^{2-} \rightarrow ((C_2H_5)_4N)_2RuO_4$$

Figure 3B:
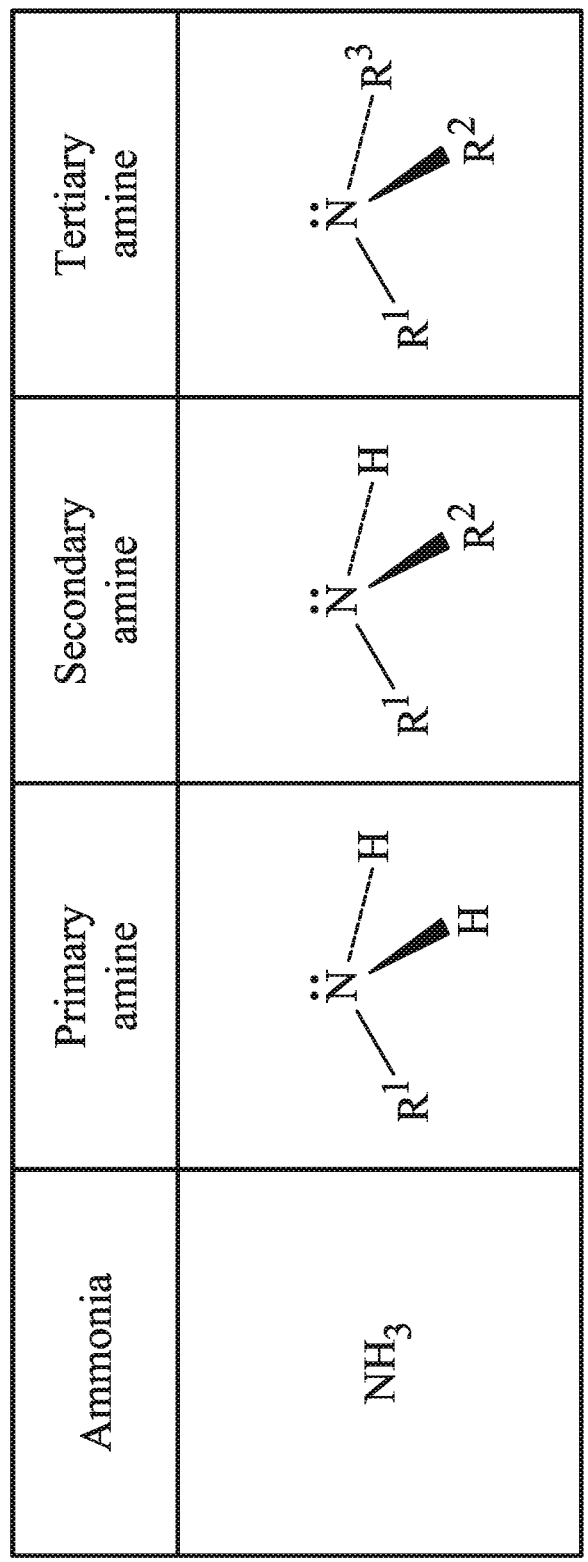
FIG. 3B illustrates example materials that may be implemented as a component in the CMP process accordingly to various aspects of the present disclosure.

FIG. 3B illustrates several types of amine compounds, such as ammonia (NH₃), primary amine, secondary amine, or tertiary amine, that may be employed according to the present disclosure. Each of these different types may be used independently or together with other types of amine compounds. These different types of amine compounds generate ammonium compounds with different numbers of organic substituents. Generally, ammonium compounds (or salts) with fewer organic substituents R exhibit higher solubility in aqueous solutions. The higher solubility facilitates removal of the ammonium ion, and consequently the removal of the associated ruthenium ions. Therefore, alkaline component comprising a primary ammonium ion may be preferable to those comprising secondary ammonium ions, which is in turn preferable to those comprising tertiary ammonium ions. In some embodiments, the identity of the R substituents also affects the solubility. For example, a longer chain substituent generally has less affinity with the water, thereby is less soluble in aqueous solutions. For example, a chain with heteroatoms generally has greater affinity with the water, thereby is more soluble in aqueous solutions. Accordingly, alkaline component comprising R substituents of a shorter alkyl chain and/or more heteroatoms may be preferable to those with longer alkyl chains and/or fewer heteroatoms.

Moreover, the amines offer another important interaction with Ru. For example, amines carry lone pairs of valence electrons that of relatively low energies. These lone pairs of valence electrons may donate into an empty valence orbital of the Ru compounds, thereby forming a coordination (or dative bond). This interaction may be illustrated as follows:

$$RuO_2 + NR_3 \rightarrow RuO_2-NR_3$$

$$[RuO_4]^{2-} + NR_3 \rightarrow [RuO_4-NR_3]^{2-}$$

$$[RuO_4]^- + NR_3 \rightarrow [RuO_4-NR_3]^-$$

These interactions are further illustrated in FIG. 3A. For example, alkaline component 358 may be an amine-based alkaline. It forms a coordination bond with Ru atoms on surfaces of the Ru particles 306. The movement of the polish pad creates circular flows of slurry, which by moving the alkaline component 358, also assists breaking-apart of the Ru particles 306 from the surface. These coordinative interactions are orders of magnitude stronger than the electrostatic interactions between the Ru-containing anions and the ammonium cations. Accordingly, by including an amine-based alkaline component, the Ru byproducts may be more easily pulled away from the Ru surface and removed at a higher rate.

Another mechanism to boost the removal rate of the Ru material is by choosing a preferred abrasive component. For example, titanium dioxide abrasives are more effective in removing Ru than silicon dioxide abrasives. Without being limited by theory, titanium dioxide may catalytically enhance Ru removal rate. For example, titanium oxide may interact with hydrogen peroxide to form titanium peroxides (TiOOH). Titanium peroxides have an oxidation potential greater than hydrogen peroxides itself, thus, based on the Pourbaix diagram of FIG. 2B, is more capable of oxidizing Ru into a higher oxidation state, such as $[RuO_4]^{2-}$ and into a more soluble form.

Apart from oxidation reactions, an ionic strength of the CMP slurry 400 may be adjusted to increase the Ru removal rate. For example, abrasive particles often carry a negative charge. Accordingly, when the Ru product includes $RuO_4^{2-}$ and/or $RuO_4^-$, electrostatic repulsion would impede the abrasive particles from accessing the Ru surface that needs to be polished. By increasing the amount of ions within the slurry composition, those additional ions serve as buffers that dilute the effect of electrostatic repulsion. This is reflected in the change of zeta potential of the Ru surface being polished as a result of the changes in ion strengths. Generally, it is preferable to have a lower zeta potential as that signifies reduced potential difference between the surface being polished and the abrasives. In some embodiments, the zeta potential may be about −60 mV to about −20 mV. If the zeta potential is too low, for example, lower than −20 mV, or too high, for example, higher than −60 mV, the electrostatic repulsion may impede the removal of Ru from the surface. The proper zeta potential may be achieved by adjusting ionic strengths of the CMP slurry to about 1 mmol/L to about 500 mmol/L, such as by adjusting the concentration of a potassium hydroxide component, a potassium chloride component, and/or a guanidinium component, etc. to about 10 mmol/L to about 1,000 mmol/L. Accordingly, the abrasive particles may become more effective in polishing the Ru surfaces, and the Ru removal rate increased.

Accordingly, as described above, selecting a proper CMP slurry 400 includes selecting a $TiO_2$ abrasive component, an amine-based alkaline component, a pH value of about 9 to about 12, and a relatively high ionic strength. This formulation provides the maximized removal rate of Ru material. Meanwhile, those factors contributing to an increased removal rate of Ru in CMP slurry 400 do not substantially increase removal rate of the dielectric material. For example, $TiO_2$ is not an effective abrasive material to polish silicon dioxide; and the oxidation component cannot oxidize silicon dioxide. Accordingly, the removal rate for the $SiO_2$ remains minimal, and a differentiation in removal rates are achieved.

Figure 6A:
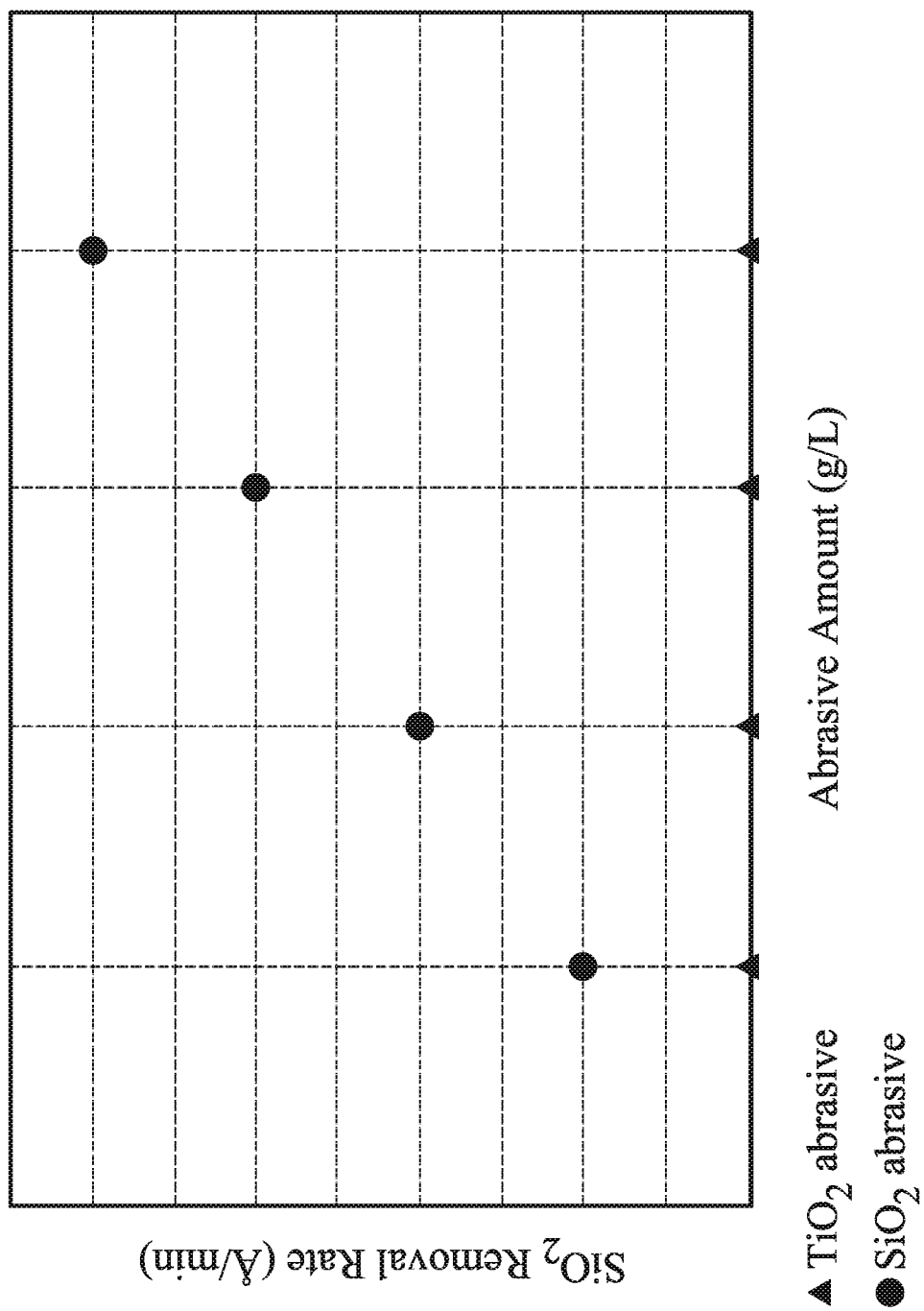
FIG. 6A illustrate a correlation between amounts of the abrasive and the removal rate of silicon dioxide material.

Referring to block 206B of FIG. 2B, the method 200B proceeds to the selection of the CMP slurry 500 for polishing the embedded surface including both the dielectric material and the conductive material. At this fabrication stage, it is advantageous for the two materials to be removed at similar rates. As described above, the removal rate of dielectric material is not sensitive to the identity of the oxidizing component, the alkaline component, and/or the acid component. In other words, the removal rate is largely determined by the abrasives component. Because $TiO_2$ has a hardness smaller than $SiO_2$, it is not an effective abrasive material for the $SiO_2$-based dielectric layer. For example, referring to FIG. 6A, increasing the amount of $TiO_2$ in the CMP slurry 500 does not lead to substantial increase in the removal rate of the $SiO_2$ material. It has been found that silicon dioxide abrasives are most effective yet economic abrasives for polishing $SiO_2$ dielectric materials. Further, the rate of removal may be adjusted by adjusting an amount of the silicon dioxide in the CMP slurry 500. For example, still referring to FIG. 6A, an increase in the amount of $SiO_2$ abrasive particles in the slurry leads to an increase of removal rate of the $SiO_2$ dielectric material. In some embodiments, the amount of $SiO_2$ abrasive particles is selected to be about 0.1% to about 15% by weight. Meanwhile, the removal rate of Ru component is less sensitive to the amount of silicon dioxide in the CMP slurry 500. Accordingly, parameters described above with respect to block 204B may be adjusted to achieve a smaller Ru removal rate, while the amount of the $SiO_2$ may be increased to match the Ru removal rate.

For example, alkaline components other than amine-based alkalines may be used. In some embodiments, the alkaline component includes potassium hydroxide. With hydrogen peroxide as the oxidizing component and a pH value of about 8 to about 11, the Ru material is removed at a rate of between about 30 and 50 Å/min. Meanwhile, the amount of $SiO_2$ abrasives may be used to adjust the removal rate for the dielectric material to match this rate. In some embodiments, the CMP slurry 500 includes an hydroxyamine alkaline component. The removal rate for Ru is about 90-110 Å/min. Again, the amount of $SiO_2$ abrasives may be further increased to match the removal rate of the dielectric material to this same rate.

For example, a lower pH may be used. The lower pH value leads to a slower Ru removal rate. In some embodiments, the pH value is maintained at about 7 to about 12. If the pH value is too low, for example, lower than 6, ruthenium tetraoxide ($RuO_4$) may be formed when a strong oxidant is present. It is known that $RuO_4$ is a toxic and explosive material and should be avoided. If the pH value is too high, the Ru removal rate may be too fast and difficult to match by simply adjusting the amount of the abrasives.

For example, the ionic strength may be adjusted to a relatively low level, such that the electrostatic repulsion may reduce Ru removal rate, while not substantially affecting the removal rate of the $SiO_2$ material. In some embodiments, the ionic strength may be at about 0.1 mmol/L to about 250 mmol/L. Accordingly, a better match between the removal rates may be achieved.

Referring to blocks 208B and 210B of the FIG. 2B, the method 200B proceeds to polishing the semiconductor device using the two selected CMP slurries respectively.

Figure 4:
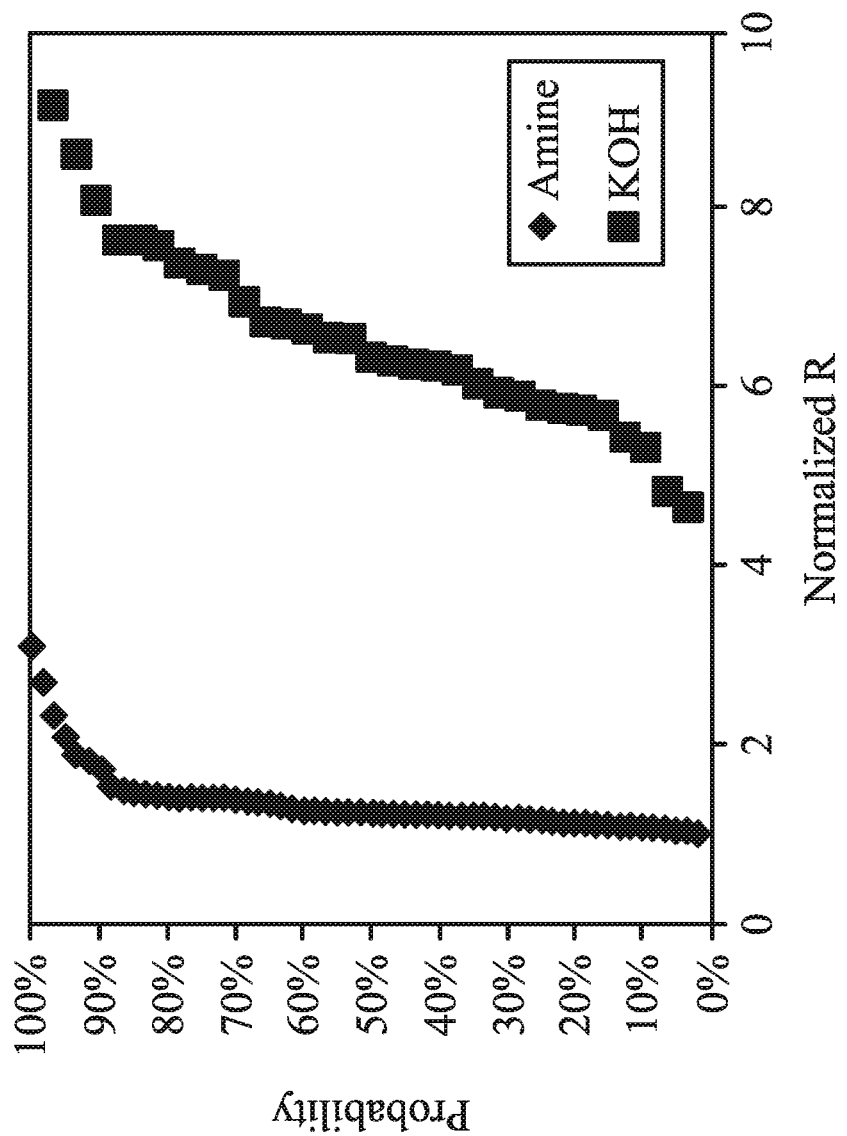
FIG. 4 is a Wafer Acceptance Test diagram illustrating a pull-up effect of potassium hydroxide as a CMP alkaline component.

Beyond adjusting the removal rates to satisfy the specific design requirements, several additional factors may be considered in choosing the components of the CMP slurries 400 and/or 500. As described above, the alkaline component may include a non-amine alkaline, for example, potassium hydroxide. Potassium hydroxide may boost the rate of Ru removal by, for example, increasing the hydroxide anion concentration in the hydrolysis reactions. However, potassium hydroxide-based alkaline component may lead to pull-up effect at the bottom of the Ru feature, for example, at the interface between the Ru feature and the metal component it forms over. In some embodiments, the Ru feature has a stretched and weakened feature bottom as compared to Ru features polished by amine-based slurries. Such a stretch increases the resistance of the Ru feature and adversely affects the device performance. Without being limited to theory, the pull-up effect may originate from a differentiated removal rate between Ru feature and the adjacent oxide material. For example, a KOH slurry may remove the oxide material at a rate faster than the Ru feature. Accordingly, a top surface of the oxide material may be lower than a top surface of the Ru feature. As the abrasive particle moves upwards from the top surface of the oxide material onto the top surface of the Ru feature, the upward movement creates an upward pull-up force, along with a forward shear force. The upward pull-up force asserted on the Ru feature causes the material to be vertically stretched. FIG. 4 illustrates a comparison of results of Wafer Acceptance Tests (WAT) between a device polished by a potassium hydroxide slurry and one polished by an amine-based slurry. For example, the lowest probability value for the resistance parameter of a device polished by a potassium hydroxide slurry is between about 6 to about 8 when that of a device polished by an amine-based slurry composition is normalized to 1.

Figure 5A:
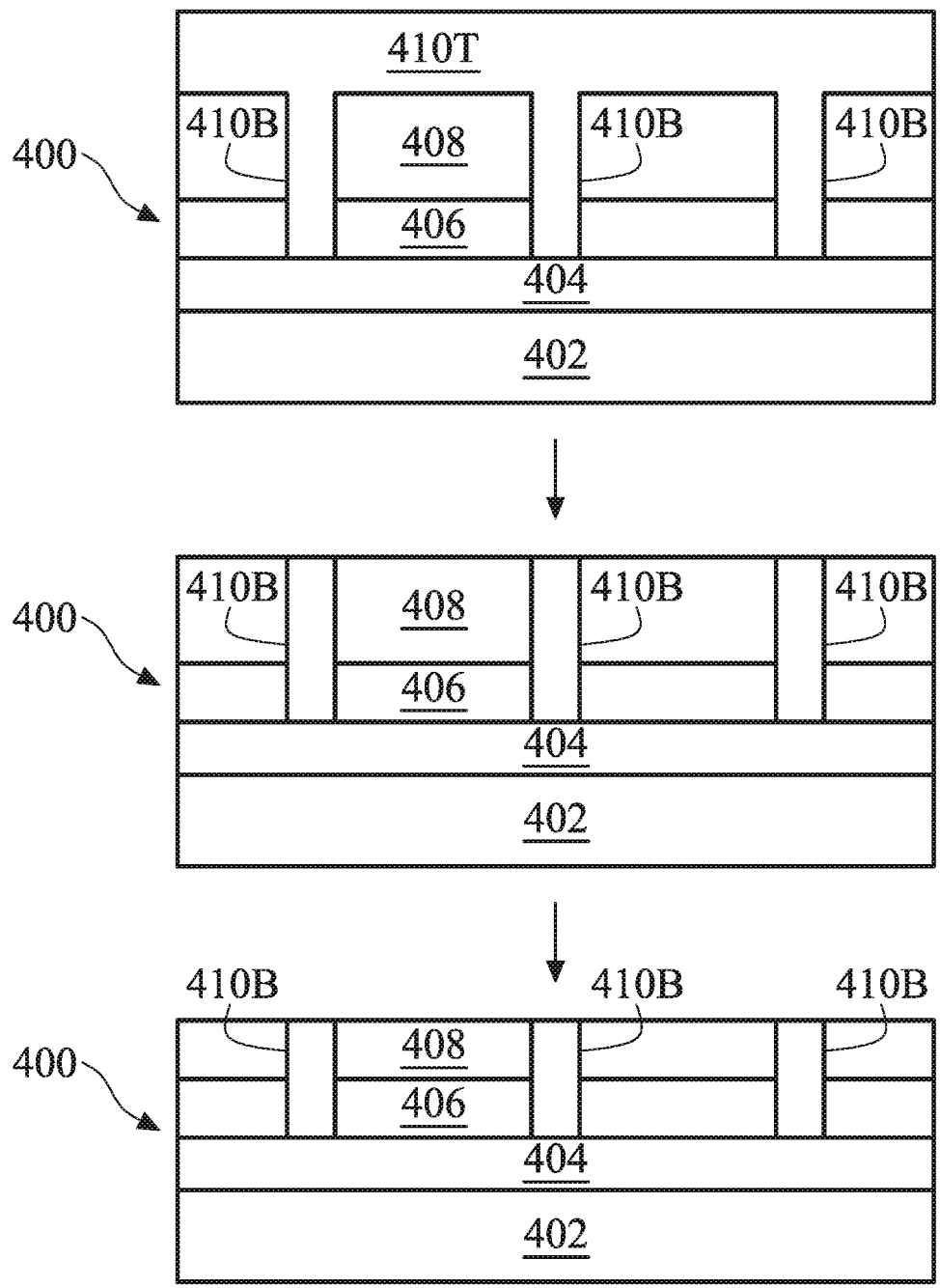

FIG. 5A illustrates an example application of the present disclosure. A semiconductor device 400 includes a first metal component 402, a second metal component 404 disposed over the metal component 402. In some embodiments, the first metal component may be cobalt (Co); and the second metal component may be tungsten (W). The semiconductor structure 100 further includes silicon nitride layer 406 disposed over the second metal component 404. Moreover, a silicon oxide layer 408 is disposed over the silicon nitride layer 406. The silicon oxide layer 408 may be an interlayer dielectric. A trench is formed within the silicon oxide layer 408 and the silicon nitride layer 406. A ruthenium feature 410 is deposited over and within the trenches in the silicon dioxide layer 408 and the silicon nitride layer 406. Therefore, the ruthenium feature 410 includes a top portion 410T, as a contact feature, and a bottom portion 410B, as a via feature, extending through the silicon dioxide layer 408 and silicon nitride layer 406, and connecting the second metal component 404 with the top portions of the ruthenium feature 410T.

Figure 2C:
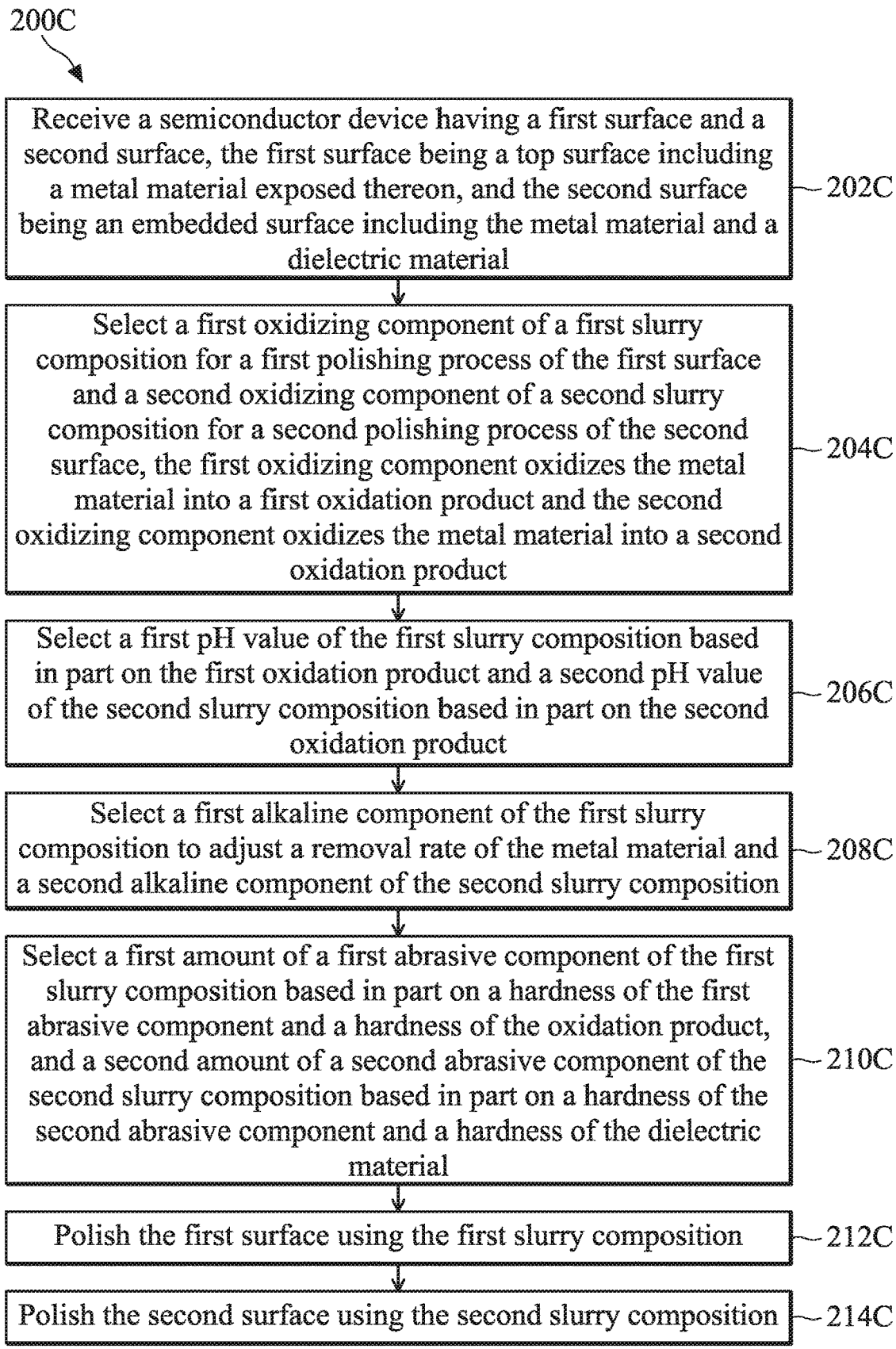

FIG. 2C illustrates an exemplary method 200C of selecting components for slurry compositions. In the depicted embodiment of FIG. 2C, the method 200C involves polishing two distinct surfaces, and involves selecting components for a first and a second slurry compositions. However, the same method may be applied to selecting components for fewer (such as one) or more (such as three or more) slurry compositions using the same or similar selection criteria. Furthermore, the selection of a corresponding component for the first and the second slurry compositions may be done together (such as shown in FIG. 2C) or separately from each other (not shown). In other words, while FIG. 2C illustrates selecting the same type of components (such as the oxidizing component) for the two slurry compositions together (such as selecting the first and the second oxidizing components in a same step 204C), such selections may be done separately (such as selecting the first oxidizing component, selecting the first pH value and/or selecting the first alkaline component, and then coming back to selecting the second oxidizing component, etc.).

Figure 6B:
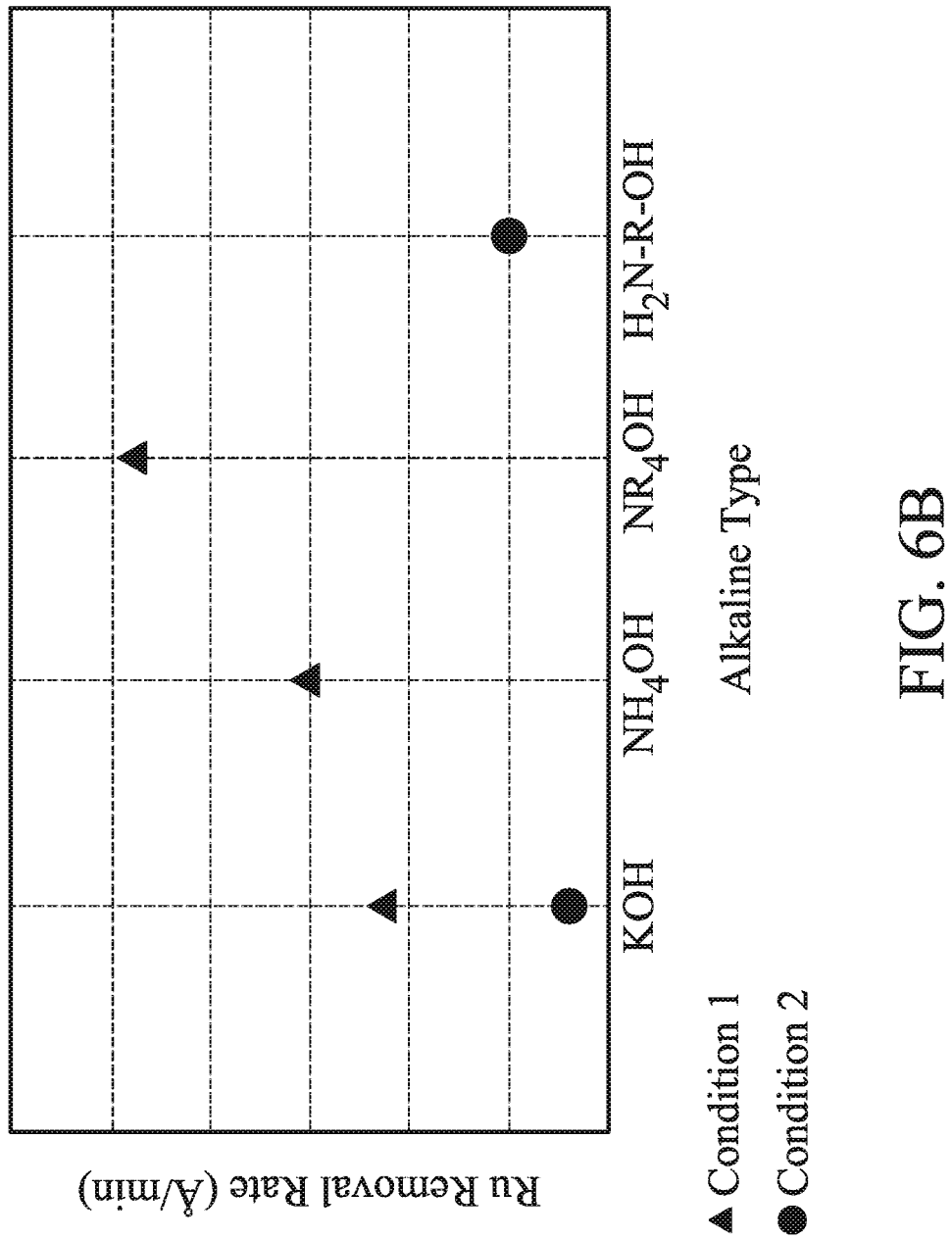
FIG. 6B illustrate relationship between alkaline type and the Ru removal rates.

In some embodiments, it may be necessary to remove the top portion 410T to expose the silicon dioxide layer 408, and to planarize the formed surfaces. Referring to FIG. 2C, appropriate CMP slurry 400 is selected according to method 200C to maximize the removal rate of the Ru feature 410T and minimize the removal rate of the silicon dioxide layer 408. For example, referring to block 204C of FIG. 2C, the oxidizing component is selected to be hydrogen peroxide. As described above, to maximize the Ru removal rate, soluble Ru byproducts, such as $[RuO_4]^{2-}$ and/or $[RuO_4]^{-}$, are more preferable than insoluble Ru byproducts. Accordingly, referring to block 206C, a pH value is selected based on this need. In some embodiments, this pH value is selected to be about 10 to about 12. Referring to block 208C of FIG. 2C, the alkaline component of the slurry composition is selected to maximize the Ru removal rate. As described above, amine-based alkalines (such as ammonium hydroxide and organoammonium hydroxide ($NR_4OH$)) not only assert electrostatic interactions with Ru materials, but also form coordination bonds with the Ru materials. Accordingly, these amine-based alkalines may provide higher Ru removal rate than, for example, potassium hydroxide. This is illustrated in FIG. 6B. Referring to block 210C of FIG. 2C, the abrasive component is selected. The abrasive component needs to have a hardness that is sufficient to effectively remove Ru byproducts. Because the Ru byproducts designed here are soluble in the aqueous solution, practically any abrasive materials suffice. Meanwhile, because the purpose is to minimize the removal rate of the dielectric material, an abrasive component should have a hardness that does not vastly exceed the dielectric material, for example, $SiO_2$. Furthermore, the abrasive material is desired to enhance the Ru removal rate (such as catalytically) more than it does the dielectric material removal rate. In some embodiments, $TiO_2$ is selected as the abrasive component. Still referring to block 212C of FIG. 2C, an amount of the abrasive component is selected. As described above and in FIG. 6B, the amount of abrasive component may be reduced in order to minimize the removal rate of the dielectric material. In some embodiments, (not shown in FIG. 2C), an ionic strength is adjusted to reduce the difference between the zeta potentials on the Ru surface and the zeta potential of the abrasive particles, so as to reduce the electrostatic repulsion and to increase the Ru removal rate. Referring to block 212C of FIG. 2C, the top surface of the semiconductor structure 400 is polished with this slurry composition.

In one embodiment, the CMP slurry 400 includes hydrogen peroxide, potassium hydroxide, and $TiO_2$. The Ru removal rate is about 230 Å/min, while the silicon dioxide dielectric material removal rate remains negligible (for example, below 10 Å/min). In some embodiments, the CMP slurry includes hydrogen peroxide, ammonium hydroxide, and $TiO_2$. The Ru removal rate is about 310 Å/min, while the silicon dioxide dielectric material removal rate remains negligible (for example, below 10 Å/min). In some embodiments, the CMP slurry includes hydrogen peroxide, organoammonium hydroxide ($NR_4OH$), and $TiO_2$. The Ru removal rate is about 480 Å/min, while the silicon dioxide dielectric material removal rate remains negligible (for example, below 10 Å/min).

In some embodiments, it may be further be necessary to reduce the height of the via feature 410B and still have a planarized the top surface. Also referring to FIG. 2C, appropriate CMP slurry 500 is similarly selected according to method 200C. Rather to enhance a difference between the removal rates, the criteria is to match those removal rates of the Ru feature 410B and of the silicon dioxide layer 408. For example, in some embodiments, the matching of the removal rates may require forming soluble oxidation products but, on average, of a slightly lower oxidation state, such as Ru(+6) rather than Ru(+7). This design choice offers a balance between a decent removal rate and the required match between removal rates. Accordingly, referring to block 206C of FIG. 2C, a pH value of about 9 to about 11, may be most appropriate. Referring to block 208C of FIG. 2C, an alkaline component may be selected. The alkaline component may be selected to achieve a decent Ru removal rate that is matchable by the $SiO_2$ removal rate (for example, by adjusting the abrasive amount, as described below). In some embodiments, potassium hydroxide and/or organic hydroxyamine ($H_2N$—R—OH) is selected. Referring to block 210C of FIG. 2C, the abrasive component is selected. A decent dielectric material (such as $SiO_2$) removal rate is needed at this fabrication stage, the abrasive component needs to have a hardness that is sufficient to effectively remove, not only Ru byproducts, but also the $SiO_2$ dielectric material. In some embodiments, $SiO_2$ is selected as the abrasive component. Still referring to block 210C of FIG. 2C, an amount of the abrasive component is selected. As described above, the amount of abrasive component may be adjusted based on, for example, the relationship illustrated in FIG. 6B. Accordingly, the amount of the abrasive component may be increased in order to match the removal rate of the dielectric material to that of the Ru material. In some embodiments (not shown in FIG. 2C), an ionic strength is adjusted such that an appropriate zeta potential difference is achieved between the Ru surface and the abrasive particles, and the removal rates are matched. Referring to block 214C of FIG. 2C, the now-exposed top surface of the semiconductor structure 500 is polished with this slurry composition.

In some embodiments, the CMP slurry 500 includes hydrogen peroxide, potassium hydroxide, and $SiO_2$. The Ru removal rate is about 40 Å/min, while the silicon dioxide dielectric material removal rate may be tuned to match the rate of 40 Å/min by adjusting an amount of the abrasive particles. In some embodiments, the CMP slurry includes hydrogen peroxide, organic hydroxyamine ($H_2N$—R—OH), and $TiO_2$. The Ru removal rate is about 100 Å/min, while the silicon dioxide dielectric material removal rate may be tuned to match the rate of 100 Å/min by adjusting an amount of the abrasive particles.

FIGS. 5B and 5C illustrate two example applications of the present disclosure. Referring to FIG. 5B, a self-aligned contact (SAC) scheme is presented. The semiconductor device 600 includes a substrate 601. A metal gate 602 is formed within ILD layer 608 over the substrate 601. Source/drain features (not shown) are formed in or on the substrate 601 and on both sides of the metal gate 602. Source/drain contacts 603 are formed to electronically connect to the source/drain features. A high-k dielectric layer 607 is formed over the metal gate and the source/drain contacts 603. A number of etch-stop layers (such as layer 606) and ILD layers (such as layers 608') are formed over the metal gate 602 and/or the source/drain contacts 603. The ILD layer 608' may include silicon dioxide. Trenches are formed within the ILD layers 608', and extend through the respective etch-stop layers 606, as well as the high-k dielectric layer 607, using a self-aligned process. A Ru layer is then deposited within the trenches to form via features 610B to electrically couple to the metal gate 602, and/or via features 610B' to electrically couple to the source/drain contact 603. The deposition of Ru layer may extend above the top surface of the ILD layer 608' thereby forming Ru layer 610T.

As described above, in some embodiments, a first CMP process may be performed to remove the entirety of the Ru layer 610T. This process may employ the CMP slurry 400 described above. According, the removal rate of Ru is maximized while the removal rate of the ILD layer 608' is minimized. Thus, the first CMP process efficiently removes the Ru layer 610T and reliably stops at the top interface of the 610T with the ILD layer 608'. After this processing step, the device 600 will have a lowered top surface. For example, surface 620 will be exposed. Subsequently, the height of the via features 610B and 610B' may be adjusted to achieve design targets. As described above, in some embodiments, a second CMP process may employ CMP slurry 500. Accordingly, the second CMP process removes a top portion of the via features 610B, that of the via features 610B', along with the top portions of the adjacent ILD layer 608', at a substantially similar removal rate. Accordingly, the device 600 maintains a substantially planar top surface throughout the second CMP process. After this second CMP process, the device 600 may have a further lowered top surface, such as the surface 630 exposed. At this processing stage, Ru via feature that couples to the metal gate 602 and/or the source/drain contact 603 are formed with controlled height. By implementing this two-step processing method, the processed device 600 may have a substantially planar top surface, and the fabrication may have increased efficiency and reliability.

Similarly, referring to FIG. 5C, a middle-end-of-line (MEOL) processing method is presented. The device 700 includes a substrate 701. A metal gate 702 is formed within ILD layer 708 over the substrate 701. Source/drain features (not shown) are formed in or on the substrate 701 and on both sides of the metal gate 702. Source/drain contacts 703 are formed to electronically connect to the source/drain features. A number of etch-stop layers (such as layers 706 and 706') and ILD layers (such as layers 708' and 708") are formed over the metal gate 702 and/or the source/drain contacts 703. Trenches are formed within the ILD layers 708' and 708" and extend through the respective etch-stop layers 706 and 706'. A Ru layer is then deposited within the trenches to form via features 710B to electrically couple to the metal gate 702, and/or via features 710B' to electrically couple to the source/drain contact 703. The deposition of Ru layer may extend above the top surface of the ILD layer 708" thereby forming Ru layer 710T.

As described above, in some embodiments, a first CMP process may be performed to remove the entirety of the Ru layer 710T. This process may employ the CMP slurry 400 described above. According, the removal rate of Ru is maximized while the removal rate of the ILD layer 708" is minimized. Thus, the first CMP process efficiently removes the Ru layer 710T and reliably stops at the top interface of the 710T with the ILD layer 708". After this processing step, the device 700 will have a lowered top surface. For example, surface 720 will be exposed. Subsequently, the height of the via features 710B and 710B' may be adjusted to achieve design targets. As described above, in some embodiments, a second CMP process may employ the CMP slurry 500. Accordingly, the second CMP process may be performed to remove a top portion of the via features 710B and that of the via features 710B' along with the top portions of the adjacent ILD layer 708", at a substantially similar removal rate. Accordingly, the device 700 maintains a substantially planar top surface throughout the second CMP process. After this second CMP process, the device 700 may have a further lowered top surface, such as the surface 730 exposed. At this processing stage, Ru via feature 710B that couples to the metal gate 702 and/or Ru via feature 710B' that couples to the source/drain contact 703 are formed with controlled heights. By implementing this two-step processing method, the processed device 700 may have a substantially planar top surface and the fabrication may have increased efficiency and reliability.

The present disclosure provides for many different embodiments. In one general aspect, the disclosure provides a method. The method includes receiving a semiconductor substrate having a metal material exposed on a first surface. The first surface has a substantially uniform material composition of the metal material. The method also includes receiving a first slurry including a first abrasive component and a first amine-based alkaline component, and polishing the exposed metal material on the first surface with the first slurry until a second surface is exposed. The second surface includes the metal material and an oxide material surrounding the metal material. Moreover, the metal material has a first removal rate in the first slurry and the oxide material has a second removal rate in the first slurry. The method further includes receiving a second slurry including a second abrasive component and a second amine-based alkaline component. The second abrasive component is different from the first abrasive component, and the second amine-based alkaline component is different from the first amine-based alkaline component. Moreover, the metal material has a third removal rate in the second slurry and the oxide material having a fourth removal rate in the second slurry. The method additionally includes polishing the metal material and the oxide material exposed on the second surface with the second slurry. A ratio of the first removal rate to the second removal rate is greater than 30:1, and a ratio of the third removal rate to the fourth removal rate is about 1:0.5 to about 1:2.

In some embodiments, the semiconductor substrate includes a metal gate structure, and the metal material exposed on the first surface is electrically coupled to the metal gate structure. In some embodiments, the metal material includes ruthenium (Ru), the first abrasive component includes titanium dioxide ($TiO_2$), and the second abrasive component includes silicon dioxide ($SiO_2$). Moreover, the first and the second slurries each include an oxidizing component having an oxidization potential sufficient to oxidize the Ru. In some embodiments, the first amine-based alkaline component includes an ammonium hydroxide, and the second amine-based alkaline component includes a hydroxyamine. In some embodiments, the method further includes adjusting the first removal rate by adjusting an ionic strength of the first slurry to a value of about 1 mmol/L to about 500 mmol/L. In some embodiments, the method further includes adjusting the fourth removal rate to approximately match the third removal rate by adjusting an amount of the second abrasive component in the second slurry. In some embodiments, the receiving of the semiconductor substrate includes receiving the semiconductor substrate that has the metal material in a contact feature and in a via feature connected to the contact feature, and that further has the oxide material in an interlayer dielectric (ILD) component surrounding the via feature and below the contact feature.

In one general aspect, the disclosure provides a method. The method includes receiving a semiconductor device having a first surface and a second surface. The first surface is a top surface including a conductive material exposed thereon; and the second surface is an embedded surface including the conductive material and a dielectric material. The method also includes selecting a first polishing slurry to achieve a first polishing rate of the conductive material in the first polishing slurry and a second polishing rate of the dielectric material in the first polishing slurry. The first polishing rate far exceeds the second polishing rate. The method further includes selecting a second polishing slurry to achieve a third polishing rate of the conductive material in the second polishing slurry and a fourth polishing rate of the dielectric material in the second polishing slurry. The third polishing rate matches the fourth polishing rate. The method additionally includes polishing the first surface with the first polishing slurry until the second surface is exposed; and polishing the second surface with the second polishing slurry.

In some embodiments, the receiving of the semiconductor device includes receiving the semiconductor device that has a conductive feature including the conductive material. The conductive feature has a top portion exposed on the first surface and fully covering the first surface. The conductive feature further has a bottom portion embedded within an interlayer dielectric (ILD) component of the dielectric material. In some embodiments, the receiving of the semiconductor device includes receiving the semiconductor device having a ruthenium (Ru) feature exposed on the first surface. The polishing of the first surface includes polishing the Ru feature. The polishing of the second surface includes polishing the Ru feature and the dielectric material. A ratio of the first polishing rate to the second polishing rate exceeds 30:1, and a ratio of the third polishing rate to the fourth polishing rate is about 1:0.5 to about 1:2. In some embodiments, the selecting of the first polishing slurry includes selecting in order to maximize a difference between the first polishing rate and the second polishing rate. Moreover, the selecting of the second polishing slurry includes selecting in order to minimize a difference between the third polishing rate and the fourth polishing rate. In some embodiments, the selecting of the first polishing slurry includes selecting an abrasive capable of catalytically enhancing the first polishing rate relative to a silicon dioxide ($SiO_2$) based abrasive. In some embodiments, the selecting of the second polishing slurry includes selecting an abrasive amount such that the fourth polishing rate approximately matches the third polishing rate. In some embodiments, the selecting of the first polishing slurry includes selecting an alkaline component having an inorganic ammonium ion or a soluble quaternary organic ammonium ion. Moreover, the selecting of the second polishing slurry includes selecting an alkaline component having an amine functional group and a hydroxy functional group.

In one general aspect, the disclosure provides a method. The method includes receiving a semiconductor device having a first surface and a second surface. The first surface is a top surface including a metal material exposed thereon, and the second surface is an embedded surface including the metal material and a dielectric material. The method also includes selecting a first oxidizing component of a first slurry composition for a first polishing process of the first surface and a second oxidizing component of a second slurry composition for a second polishing process of the second surface. The first oxidizing component oxidizes the metal material into a first oxidation product and the second oxidizing component oxidizes the metal material into a second oxidation product. The method further includes selecting a first pH value of the first slurry composition based in part on the first oxidation product and a second pH value of the second slurry composition based in part on the second oxidation product. The method also includes selecting a first alkaline component of the first slurry composition to adjust a removal rate of the metal material and a second alkaline component of the second slurry composition. The method also includes selecting a first amount of a first abrasive component of the first slurry composition based in part on a hardness of the first abrasive component and a hardness of the oxidation product, and a second amount of a second abrasive component of the second slurry composition based in part on a hardness of the second abrasive component and a hardness of the dielectric material. The method additionally includes polishing the first surface using the first slurry composition, and polishing the second surface using the second slurry composition. The first oxidizing component differs from the second oxidizing component. The first alkaline component differs from the second alkaline component. The first abrasive component differs from the second abrasive component. Moreover, the selecting of the second amount of the second abrasive component includes matching a first removal rate of the dielectric material in the second slurry composition to a second removal rate of the metal material in the second slurry composition.

In some embodiments, a ratio of a first removal rate to the second removal rate is about 2:1 to about 1:2. In some embodiments, the selecting of the first oxidizing component, the first pH value, the first alkaline component, and the first amount of the first abrasive component includes selecting to maximize a removal rate of the metal material in the first slurry composition. In some embodiments, a ratio of a third removal rate of the dielectric material in the first slurry composition to a fourth removal rate of the metal material in the first slurry composition is less than 1:30. In some embodiments, the receiving of the semiconductor device includes receiving the semiconductor having ruthenium (Ru) as the metal material on the first and the second surfaces, and having silicon dioxide ($SiO_2$) as the dielectric material on the second surface.

The foregoing outlines features of several embodiments so that those skilled in the art may better understand the aspects of to present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a semiconductor substrate having a metal material of ruthenium (Ru) exposed on a first surface, the first surface having a uniform material composition of the metal material;
   receiving a first slurry including a first abrasive component of titanium oxide and a first amine-based alkaline component of ammonium hydroxide;
   polishing the exposed metal material on the first surface with the first slurry until a second surface is exposed, the second surface including the metal material and a dielectric material, wherein the metal material has a first polishing rate and the dielectric material has a second polishing rate;
   receiving a second slurry including a second abrasive component of silicon oxide, a second amine-based alkaline component of hydroxyamine, and a non-amine alkaline component; and
   polishing the metal material and the dielectric material exposed on the second surface with the second slurry.

2. The method of claim 1, wherein the semiconductor substrate includes a metal gate structure, and the metal material exposed on the first surface is electrically coupled to the metal gate structure.

3. The method of claim 1, wherein the second amine-based alkaline component includes a hydroxyamine ($H_2N$—R—OH), where R is an organic residue having a substituted alkyl group with a carbon chain of 1 to 20 carbon atoms.

4. The method of claim 1, further comprising adjusting an ionic strength of the first slurry to a value of about 1 mmol/L to about 500 mmol/L.

5. The method of claim 1, wherein the receiving of the semiconductor substrate includes receiving the semiconductor substrate having the metal material in a contact feature and in a via feature connected to the contact feature and having silicon oxide in an interlayer dielectric (ILD) component surrounding the via feature and below the contact feature.

6. The method of claim 1, wherein a zeta potential of the first surface is about-60 mV to about-20 mV.

7. A method, comprising:
   receiving a semiconductor device having a first surface and a second surface, the first surface being a top surface including a first conductive feature of ruthenium (Ru) exposed thereon, the first surface having a uniform material composition of Ru, and the second surface including a second conductive feature of Ru and a dielectric material;
   selecting a first polishing slurry including a first abrasive component of titanium oxide and a first amine-based alkaline component of ammonium hydroxide;
   selecting a second polishing slurry to achieve a first polishing rate of Ru in the second polishing slurry and a second polishing rate of the dielectric material in the second polishing slurry, wherein the second polishing slurry includes a second abrasive component of silicon oxide, a second amine-based alkaline component of hydroxyamine, and a non-amine alkaline component;
   polishing the first surface with the first polishing slurry until the second surface is exposed; and
   polishing the second surface with the second polishing slurry.

8. The method of claim 7, wherein the first conductive feature is a contact feature, the second conductive feature is a via feature, and the second conductive feature is embedded within an interlayer dielectric layer (ILD) having the dielectric material.

9. The method of claim 7, wherein the dielectric material includes silicon oxide.

10. The method of claim 7,
    wherein the polishing of the first surface includes polishing the first conductive feature, and
    wherein the polishing of the second surface includes polishing the second conductive feature and the dielectric material.

11. The method of claim 7, wherein the selecting of the second polishing slurry includes selecting in order to minimize a difference between the first polishing rate and the second polishing rate.

12. The method of claim 7, wherein the selecting of the first polishing slurry includes selecting a first acid component having nitric acid, and wherein the selecting of the second polishing slurry includes selecting a second acid component having acetic acid.

13. The method of claim 7, wherein the second amine-based alkaline component includes a hydroxyamine ($H_2N$—R—OH), where R is an organic residue having a substituted alkyl group with a carbon chain of 1 to 20 carbon atoms.

14. A method, comprising:
    receiving a semiconductor device having a first surface and a second surface, the first surface being a top surface including a metal material of ruthenium (Ru) exposed thereon, the first surface having a uniform material composition of the metal material, and the second surface being an embedded surface including the metal material and a dielectric material;
    selecting a first oxidizing component of a first slurry composition for a first polishing process of the first surface and a second oxidizing component of a second slurry composition for a second polishing process of the second surface, the first oxidizing component oxidizes the metal material into a first oxidation product and the second oxidizing component oxidizes the metal material into a second oxidation product;
    selecting a first pH value of the first slurry composition based in part on the first oxidation product and a second pH value of the second slurry composition based in part on the second oxidation product;
    selecting a first alkaline component of the first slurry composition to adjust a removal rate of the metal material and a second alkaline component of the second slurry composition;
    selecting a first amount of a first abrasive component of the first slurry composition based in part on a hardness of the first abrasive component and a hardness of the first oxidation product, and a second amount of a second abrasive component of the second slurry composition based in part on a hardness of the second abrasive component and a hardness of the dielectric material;
    polishing the first surface using the first slurry composition; and polishing the second surface using the second slurry composition, wherein the first oxidizing component differs from the second oxidizing component, the first alkaline component differs from the second alkaline component, the first abrasive component differs from the second abrasive component, and wherein the selecting of the second amount of the second abrasive component includes making a ratio of a first removal rate of the dielectric material in the second slurry composition to a second removal rate of the metal material in the second slurry composition to be about 1:0.5 to about 1:2.

15. The method of claim 14, wherein the second alkaline component includes a hydroxyamine ($H_2N$—R—OH), where R is an organic residue having a substituted alkyl group with a carbon chain of 1 to 20 carbon atoms.

16. The method of claim 14, wherein the selecting of the first oxidizing component, the first pH value, the first alkaline component, and the first amount of the first abrasive component includes selecting to maximize a removal rate of the metal material in the first slurry composition.

17. The method of claim 14, wherein a ratio of a third removal rate of the dielectric material in the first slurry composition to a fourth removal rate of the metal material in the first slurry composition is less than 1:30.

18. The method of claim 14, wherein the dielectric material includes silicon dioxide ($SiO_2$).

19. The method of claim 14, further comprising selecting a first acid of the first slurry composition and a second acid of the second slurry composition, the first acid being different from the second acid.

20. The method of claim 14, wherein polishing of the first surface using the first slurry composition includes forming anion forms of Ru including $[RuO_4]^{2-}$, $[RuO_4]^-$, or a combination thereof.

* * * * *